US008866536B1

(12) United States Patent
Chen

(10) Patent No.: US 8,866,536 B1
(45) Date of Patent: Oct. 21, 2014

(54) PROCESS MONITORING CIRCUIT AND METHOD

(71) Applicant: United Microelectronics Corp., Hsin-Chu (TW)

(72) Inventor: Hsi-Wen Chen, Kaohsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/079,655

(22) Filed: Nov. 14, 2013

(51) Int. Cl.
*G05F 1/10* (2006.01)
*G05F 3/08* (2006.01)

(52) U.S. Cl.
CPC .................................... *G05F 3/08* (2013.01)
USPC ............................ 327/512; 327/513; 374/101

(58) Field of Classification Search
CPC ......... G05F 3/245; G05F 3/225; G05F 1/567; H03L 1/02–1/028
USPC ............................ 327/512, 513; 374/101–103
See application file for complete search history.

(56) References Cited

U.S. PATENT DOCUMENTS

| | | | |
|---|---|---|---|
| 3,663,828 A | 5/1972 | Low | |
| 3,818,402 A | 6/1974 | Golaski | |
| 4,163,944 A | 8/1979 | Chambers | |
| 4,245,355 A | 1/1981 | Pascoe | |
| 4,409,608 A | 10/1983 | Yoder | |
| 4,816,784 A | 3/1989 | Rabjohn | |
| 5,159,205 A | 10/1992 | Gorecki | |
| 5,208,725 A | 5/1993 | Akcasu | |
| 5,212,653 A | 5/1993 | Tanaka | |
| 5,315,230 A | 5/1994 | Cordoba | |
| 5,406,447 A | 4/1995 | Miyazaki | |
| 5,446,309 A | 8/1995 | Adachi | |
| 5,499,214 A | 3/1996 | Mori | |
| 5,583,359 A | 12/1996 | Ng | |
| 5,637,900 A | 6/1997 | Ker | |
| 5,638,418 A * | 6/1997 | Douglass et al. | 377/25 |
| 5,760,456 A | 6/1998 | Grzegorek | |
| 5,808,330 A | 9/1998 | Rostoker | |
| 5,899,570 A * | 5/1999 | Darmawaskita et al. | 374/170 |
| 5,923,225 A | 7/1999 | De Los Santos | |
| 5,959,820 A | 9/1999 | Ker | |
| 6,008,102 A | 12/1999 | Alford | |
| 6,011,386 A | 1/2000 | Li | |
| 6,081,146 A | 6/2000 | Shiochi | |
| 6,172,378 B1 | 1/2001 | Hull | |
| 6,194,739 B1 | 2/2001 | Ivanov | |
| 6,246,271 B1 | 6/2001 | Takada | |
| 6,285,578 B1 | 9/2001 | Huang | |
| 6,291,872 B1 | 9/2001 | Wang | |
| 6,370,372 B1 | 4/2002 | Molnar | |
| 6,407,412 B1 | 6/2002 | Iniewski | |
| 6,427,226 B1 | 7/2002 | Mallick | |
| 6,448,858 B1 | 9/2002 | Helms | |
| 6,452,442 B1 | 9/2002 | Laude | |

(Continued)

*Primary Examiner* — Thomas J Hiltunen
(74) *Attorney, Agent, or Firm* — Winston Hsu; Scott Margo

(57) ABSTRACT

A process monitoring circuit may be used to determine appropriate voltage for integrated circuits including a non-volatile memory. The process monitoring circuit includes a bandgap reference, a clock generator, a negative bias circuit, a temperature insensitive oscillator, a low dropout voltage regulator, a counter, a comparison circuit, and a charge. The process monitoring circuit may also include a pulse width generator. The process monitoring circuit is able to determine the process corner of which a monitored circuit belongs to and generate an output voltage according to the process corner of the monitored circuit.

20 Claims, 11 Drawing Sheets

(56) References Cited

U.S. PATENT DOCUMENTS

| | | | |
|---|---|---|---|
| 6,456,221 B2 | 9/2002 | Low | |
| 6,461,914 B1 | 10/2002 | Roberts | |
| 6,480,137 B2 | 11/2002 | Kulkarni | |
| 6,483,188 B1 | 11/2002 | Yue | |
| 6,486,765 B1 | 11/2002 | Katayanagi | |
| 6,509,805 B2 | 1/2003 | Ochiai | |
| 6,518,165 B1 | 2/2003 | Yoon | |
| 6,521,939 B1 | 2/2003 | Yeo | |
| 6,545,547 B2 | 4/2003 | Fridi | |
| 6,560,306 B1 | 5/2003 | Duffy | |
| 6,588,002 B1 | 7/2003 | Lampaert | |
| 6,593,838 B2 | 7/2003 | Yue | |
| 6,603,360 B2 | 8/2003 | Kim | |
| 6,608,363 B1 | 8/2003 | Fazelpour | |
| 6,611,223 B2 | 8/2003 | Low | |
| 6,625,077 B2 | 9/2003 | Chen | |
| 6,630,897 B2 | 10/2003 | Low | |
| 6,639,298 B2 | 10/2003 | Chaudhry | |
| 6,653,868 B2 | 11/2003 | Oodaira | |
| 6,668,358 B2 | 12/2003 | Friend | |
| 6,700,771 B2 | 3/2004 | Bhattacharyya | |
| 6,720,608 B2 | 4/2004 | Lee | |
| 6,724,677 B1 | 4/2004 | Su | |
| 6,756,656 B2 | 6/2004 | Lowther | |
| 6,795,001 B2 | 9/2004 | Roza | |
| 6,796,017 B2 | 9/2004 | Harding | |
| 6,798,011 B2 | 9/2004 | Adan | |
| 6,806,698 B2 * | 10/2004 | Gauthier et al. | 324/76.41 |
| 6,810,242 B2 | 10/2004 | Molnar | |
| 6,814,485 B2 * | 11/2004 | Gauthier et al. | 374/170 |
| 6,822,282 B2 | 11/2004 | Randazzo | |
| 6,822,312 B2 | 11/2004 | Sowlati | |
| 6,833,756 B2 | 12/2004 | Ranganathan | |
| 6,841,847 B2 | 1/2005 | Sia | |
| 6,847,572 B2 | 1/2005 | Lee | |
| 6,853,272 B1 | 2/2005 | Hughes | |
| 6,876,056 B2 | 4/2005 | Tilmans | |
| 6,885,534 B2 | 4/2005 | Ker | |
| 6,893,154 B2 * | 5/2005 | Gold et al. | 374/170 |
| 6,901,126 B1 | 5/2005 | Gu | |
| 6,905,889 B2 | 6/2005 | Lowther | |
| 6,909,149 B2 | 6/2005 | Russ | |
| 6,927,664 B2 | 8/2005 | Nakatani | |
| 6,958,522 B2 | 10/2005 | Clevenger | |
| 7,009,252 B2 | 3/2006 | Lin | |
| 7,027,276 B2 | 4/2006 | Chen | |
| 7,205,612 B2 | 4/2007 | Cai | |
| 7,262,069 B2 | 8/2007 | Chung | |
| 7,365,627 B2 | 4/2008 | Yen | |
| 7,368,761 B1 | 5/2008 | Lai | |
| 7,388,447 B1 | 6/2008 | Potanin | |
| 7,391,276 B2 | 6/2008 | Sakaguchi | |
| 7,405,642 B1 | 7/2008 | Hsu | |
| 7,619,486 B1 * | 11/2009 | Lesea | 331/176 |
| 7,672,100 B2 | 3/2010 | Van Camp | |
| 7,961,027 B1 * | 6/2011 | Chen et al. | 327/291 |
| 8,369,170 B2 * | 2/2013 | Chen | 365/211 |
| 8,662,747 B2 * | 3/2014 | Yeh | 374/170 |
| 2002/0019123 A1 | 2/2002 | Ma | |
| 2002/0036545 A1 | 3/2002 | Fridi | |
| 2002/0188920 A1 | 12/2002 | Lampaert | |
| 2003/0076636 A1 | 4/2003 | Ker | |
| 2003/0127691 A1 | 7/2003 | Yue | |
| 2003/0155903 A1 * | 8/2003 | Gauthier et al. | 324/76.41 |
| 2003/0156622 A1 * | 8/2003 | Gold et al. | 374/170 |
| 2003/0183403 A1 | 10/2003 | Kluge | |
| 2005/0068112 A1 | 3/2005 | Glenn | |
| 2005/0068113 A1 | 3/2005 | Glenn | |
| 2005/0087787 A1 | 4/2005 | Ando | |
| 2006/0006431 A1 | 1/2006 | Jean | |
| 2006/0108694 A1 | 5/2006 | Hung | |
| 2006/0267102 A1 | 11/2006 | Cheng | |
| 2007/0102745 A1 | 5/2007 | Hsu | |
| 2007/0210416 A1 | 9/2007 | Hsu | |
| 2007/0234554 A1 | 10/2007 | Hung | |
| 2007/0246801 A1 | 10/2007 | Hung | |
| 2007/0249294 A1 | 10/2007 | Wu | |
| 2007/0296055 A1 | 12/2007 | Yen | |
| 2008/0084249 A1 * | 4/2008 | Noguchi | 331/66 |
| 2008/0094166 A1 | 4/2008 | Hsu | |
| 2008/0185679 A1 | 8/2008 | Hsu | |
| 2008/0189662 A1 | 8/2008 | Nandy | |
| 2008/0200132 A1 | 8/2008 | Hsu | |
| 2008/0299738 A1 | 12/2008 | Hsu | |
| 2008/0303623 A1 | 12/2008 | Hsu | |
| 2009/0029324 A1 | 1/2009 | Clark | |
| 2009/0201625 A1 | 8/2009 | Liao | |
| 2010/0279484 A1 | 11/2010 | Wang | |

* cited by examiner

| Process | Count | Binary address |
|---------|-------|----------------|
| FF | 62 ~ 70 | 101 |
| FS | 53 ~ 61 | 100 |
| TT | 43 ~ 52 | 011 |
| SF | 33 ~ 42 | 010 |
| SS | 0 ~ 32 | 001 |

FIG. 9

PROCESS MONITORING CIRCUIT AND METHOD

BACKGROUND OF THE INVENTION

1. Field of the Invention

The present invention discloses a process monitoring system, and more particularly, a process monitoring circuit and process monitoring method to be used for applications such as generation of threshold voltage for non-volatile memory.

2. Description of the Prior Art

For non-volatile memory, each memory cell stores one bit of information. A way to store the one bit is by supporting two states of the memory cell—one state represents a logical "0" and the other state represents a logical "1". The two states are implemented by having a floating gate above the channel of the memory cell and having two valid states for the amount of charge stored within the floating gate. Typically, one state with zero charge in the floating gate represents the logical "1" and another state with some amount of negative charge in the floating gate represents the logical "0". Having negative charge in the floating gate causes the threshold voltage of a transistor of the cell to increase. The threshold voltage is the voltage applied to the gate of the transistor in order to cause the transistor to conduct. The stored bit is read by checking the threshold voltage of the memory cell: if the threshold voltage is at a high state then the bit value is "0" and if the threshold voltage is at a low state then the bit value is "1". If the memory cell stores a value of "1", the cell typically has a negative threshold voltage. Similarly, if the cell stores a value of "0", the cell typically has a positive threshold voltage. To correctly identify in which of the two states the memory cell is currently located, a comparison is made against a reference voltage value that is in the middle of the two states, and thus determining if the threshold voltage is below or above the reference value.

Non-volatile memories are not exactly identical in their characteristics and behavior due to variation of fabrication parameters. The variations are referred to as process corner. A group of non-volatile memories having been fabricated at the same time does produce non-volatile memories having the same process corner and thus affecting the threshold voltage of each of the non-volatile memories. Therefore, same programming operation may not be applied to the non-volatile memories. If an incompatible threshold voltage is used for the programming operation, though the cell may work properly in the beginning, after a large number of programming cycles, i.e., 100 times, the non-volatile memory has a tendency to have a spurious programming operation due to the buildup of offset in the threshold voltage.

SUMMARY OF THE INVENTION

A first embodiment of a process monitoring circuit is disclosed. The process monitoring circuit comprises a bandgap reference circuit configured to generate a bandgap reference voltage; a clock generator configured to generate a first clock, a negative bias circuit coupled between the bandgap reference circuit and the clock generator and configured to generate a negative bias voltage according to the bandgap reference voltage for stabilizing operation of the clock generator, a temperature insensitive oscillator configured to generate a second clock, a low dropout voltage regulator coupled to the temperature insensitive oscillator and configured to generate a zero temperature coefficient voltage for stabilizing operation of the temperature insensitive oscillator, a counter coupled to the clock generator and the temperature insensitive oscillator and configured to count number of pulses of the second clock within each duty cycle of the first clock so as to generate a counted number, a comparison circuit coupled to the counter and configured to compare the counted number with at least one reference number to generate a comparison result, and a charge pump coupled to the comparison circuit and configured to generate an output voltage according to the comparison result.

A second embodiment of the process monitoring circuit is disclosed. The process monitoring circuit comprises a bandgap reference circuit configured to generate a bandgap reference voltage, a clock generator configured to generate a first clock, a negative bias circuit coupled between the bandgap reference circuit and the clock generator and configured to generate a negative bias voltage according to the bandgap reference voltage for stabilizing operation of the clock generator, a pulse width generator coupled to the clock generator and configured to generate a third clock according to the first clock, a temperature insensitive oscillator configured to generate a second clock, a low dropout voltage regulator coupled to the temperature insensitive oscillator and configured to generate a zero temperature coefficient voltage for stabilizing operation of the temperature insensitive oscillator, a counter coupled to the pulse width generator and the temperature insensitive oscillator and configured to count number of pulses of the second clock within each duty cycle of the third clock so as to generate a counted number, a comparison circuit coupled to the counter and configured to compare the counted number with at least one reference number to generate a comparison result, and a charge pump coupled to the comparison circuit and configured to generate an output voltage according to the comparison result.

A method of process monitoring according to the embodiment of the present invention is disclosed. The method of process monitoring comprises generating a bandgap reference voltage, generating a negative bias voltage according to the bandgap reference voltage, generating a first reference current for a clock generator according to the negative bias voltage, generating a first clock according to the first reference current, generating a zero temperature coefficient voltage according to the negative bias voltage, generating a second clock by the temperature insensitive oscillator according to the zero temperature coefficient voltage, generating a counted number according to the first clock and the second clock, comparing the counted number with at least one reference number to generate a comparison result, and generating an output voltage according to the comparison result.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 9 illustrates a look up table for the comparison circuit according to the process monitoring system.

DETAILED DESCRIPTION

For an integrated circuit, three parameters that affect operation include process corner, voltage variation and temperature variation. Process corner is the variation of fabrication parameters applied to semiconductor wafer during fabrication of an integrated circuit. Possible corners may include: typical-typical (TT), fast-fast (FF), slow-slow (SS), fast-slow (FS), and slow-fast (SF). The present invention discloses a process monitoring system for generating an output voltage that is not affected by voltage variation and temperature variation. The process monitoring circuit shall generate the output voltage for the integrated circuit with respect to the process corner that the integrated circuit belongs to.

Figure 1:
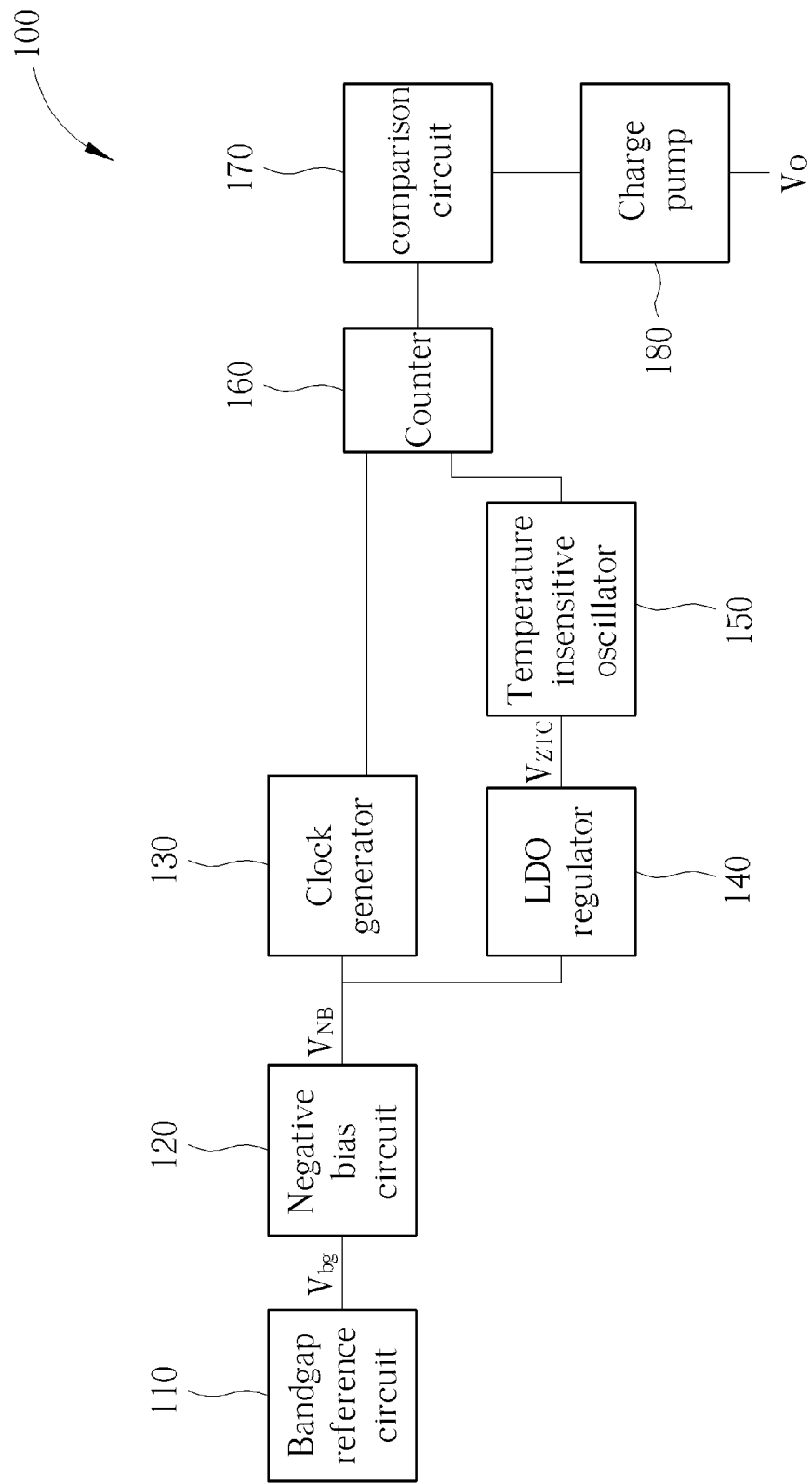
FIG. 1 illustrates a block diagram of a process monitoring circuit according to a first embodiment of the process monitoring system.

Please refer to FIG. 1. FIG. 1 illustrates a block diagram of a process monitoring circuit 100 according to a first embodiment of the process monitoring system. The block diagram of the process monitoring circuit according to the first embodiment comprises a bandgap reference circuit 110, a negative bias circuit 120, a clock generator 130, a low dropout regulator 140, a temperature insensitive oscillator 150, a counter 160, a comparison circuit 170, and a charge pump 180. The bandgap reference circuit 110 is configured to generate a bandgap reference voltage $V_{bg}$. The negative bias circuit 120 generates a negative bias voltage $V_{NB}$ according to the bandgap reference voltage $V_{bg}$. The clock generator 130 generates a first clock according to the negative bias voltage $V_{NB}$. The low dropout regulator 140 generates a zero temperature coefficient voltage $V_{ZTC}$. The temperature insensitive oscillator 150 generates a second clock according to the zero temperature coefficient voltage $V_{ZTC}$. The counter 160 counts the pulses generated by the second clock during each on or off cycle of the first clock. Note that the clock period of first clock is at least two times longer than a clock period of the second clock. The comparison circuit 170 generates a comparison result by comparing a counted number from the counter 160 and a plurality of reference number according to a plurality of respective process corners. The charge pump 180 generates an output voltage $V_O$ according to the comparison result.

Figure 2:
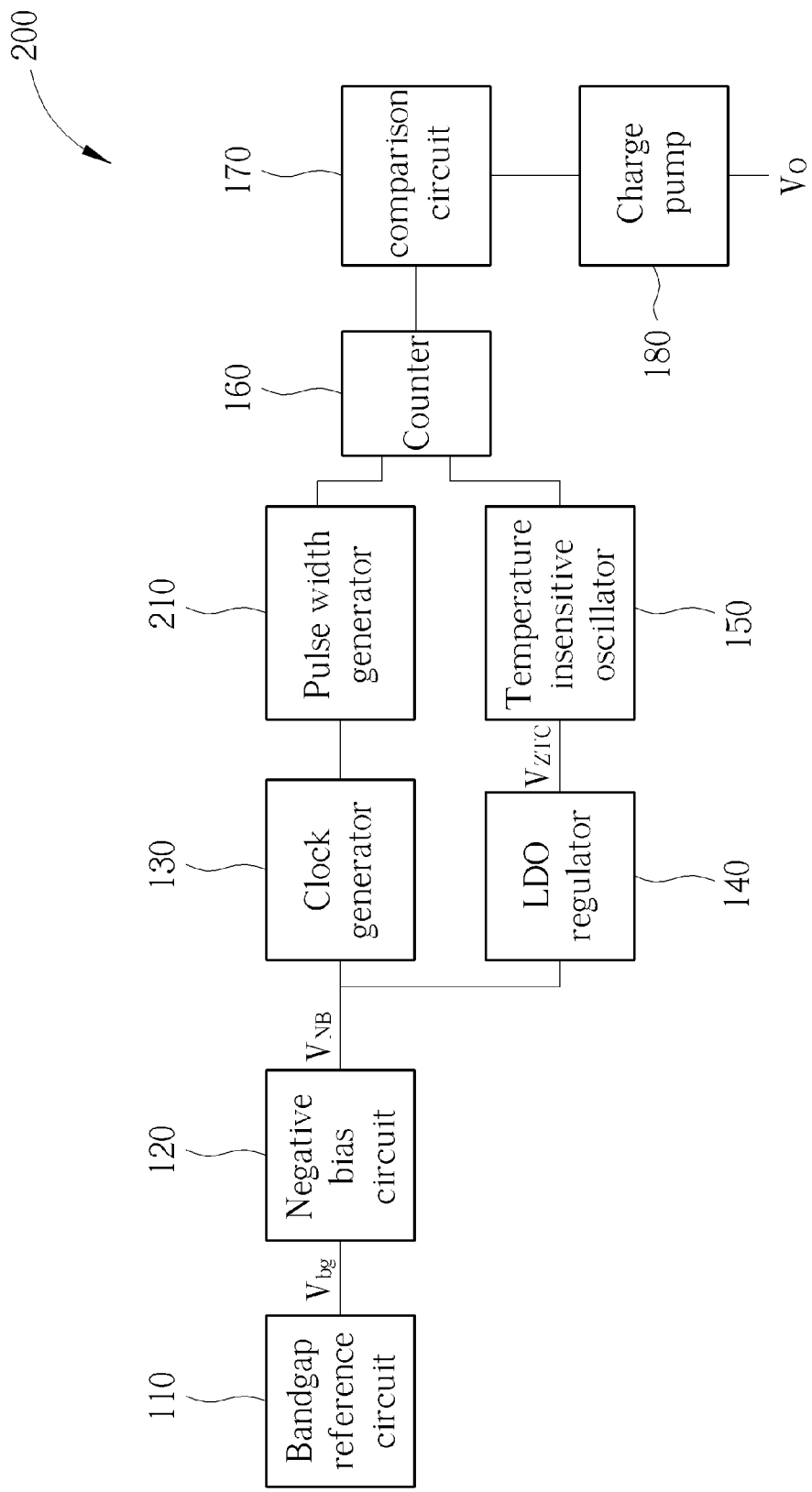
FIG. 2 illustrates the block diagram of a process monitoring circuit according to a second embodiment of the process monitoring system.

Please refer to FIG. 2. FIG. 2 illustrates a block diagram of a process monitoring circuit 200 according to a second embodiment of the process monitoring system. The block diagram of the process monitoring circuit 200 according to the second embodiment comprises the bandgap reference circuit 110, the negative bias circuit 120, the clock generator 130, a pulse width generator 210, the low dropout regulator 140, the temperature insensitive oscillator 150, the counter 160, the comparison circuit 170, and the charge pump 180. The bandgap reference circuit 110 is configured to generate a bandgap reference voltage $V_{bg}$. The negative bias circuit 120 generates a negative bias voltage $V_{NB}$ according to the bandgap reference voltage $V_{bg}$. The clock generator 130 generates a first clock according to the negative bias voltage $V_{NB}$. The pulse width generator 210 generates a third clock according to number of pulses of the first clock. The low dropout regulator 140 generates a zero temperature coefficient voltage $V_{ZTC}$. The temperature insensitive oscillator 150 generates a second clock according to the zero temperature coefficient voltage $V_{ZTC}$. The counter 160 counts the pulses generated by the second clock during each on or off cycle of the third clock. Note that the clock period of third clock is at least two times longer than the clock period of the second clock. The comparison circuit 170 generates the comparison result by comparing the counted number from the counter and the plurality of reference number according to the plurality of respective process corners. The charge pump 180 generates the output voltage $V_O$ according to the comparison result.

The difference between the first embodiment and the second embodiment of the process monitoring system is the use of the pulse width generator 210. The pulse width generator 210 is to be used if first clock does not generate a clock period having twice the length of clock period of the second clock. The pulse width generator 210 shall generate the third clock according to number of pulses of the first clock. The third clock generated will have clock period at least two times longer than that of the second clock.

The bandgap reference circuit 110 is a temperature independent voltage reference circuit. The reference voltage produced is fixed and is regardless to power supply variation, temperature variation and load variation. A typical bandgap reference circuit may have an output voltage of 1.25V which is close to the theoretical bandgap of silicon at 0 Kelvin.

The negative bias circuit 120 is a type of circuit that can be used to establish a predetermined voltage or current at various points of an integrated circuit to establish proper operating conditions for a sub-circuit. The word biasing means a systematic deviation of a value from a reference value. For the present invention, the negative bias circuit 120 is set to generate the negative bias voltage $V_{NB}$ corresponding from a reference value, the bandgap reference voltage $V_{bg}$. The negative bias circuit 120 supplies the clock generator 130 and the low dropout regulator 140 with a steady voltage, the negative bias voltage $V_{NB}$.

Figure 3:
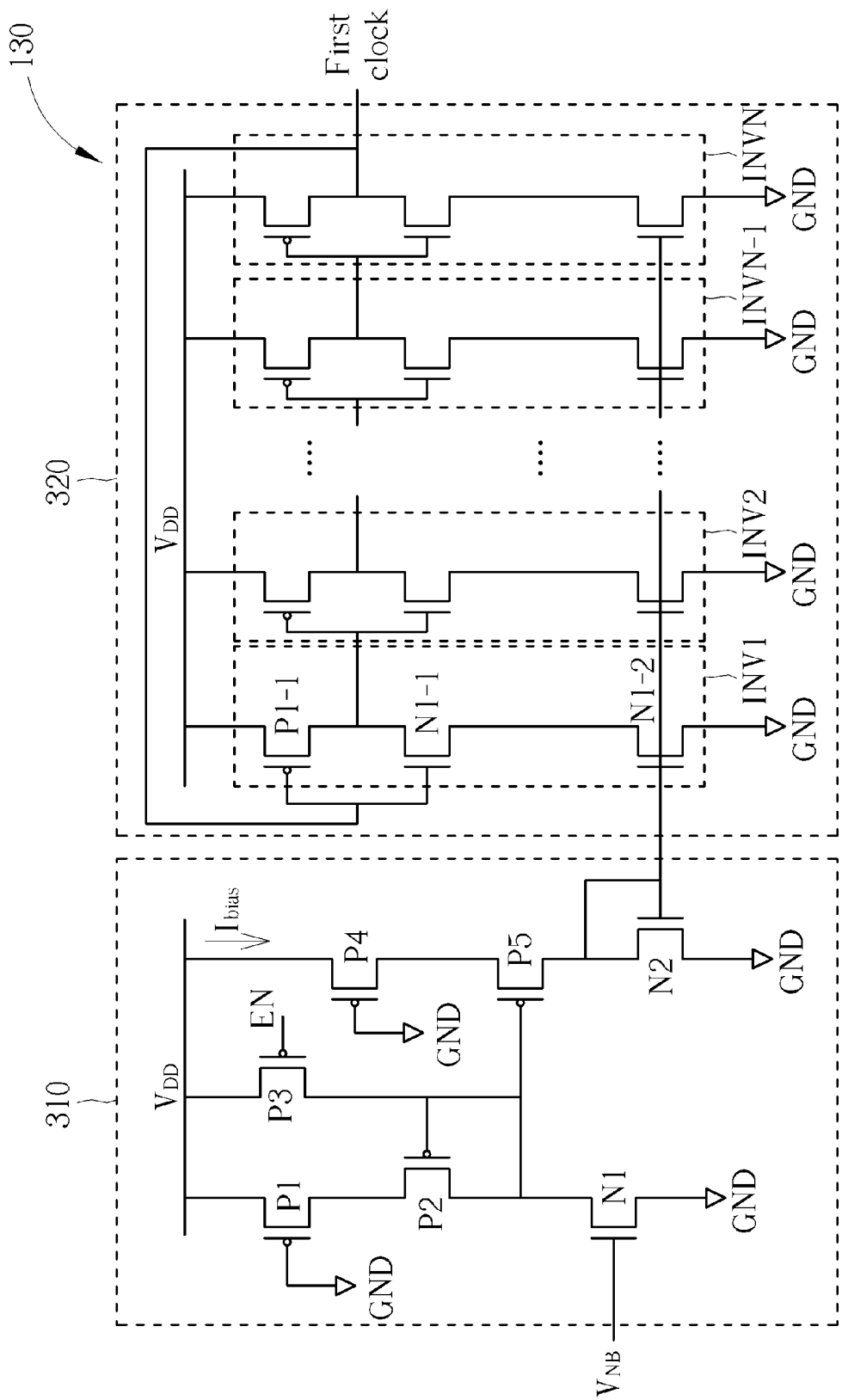
FIG. 3 illustrates a circuit of a clock generator according to the process monitoring system.

Please refer to FIG. 3. FIG. 3 illustrates a circuit diagram of the clock generator 130. The clock generator 130 comprises a bias current generator 310 and a ring oscillator 320. The bias current generator 310 is coupled to the ring oscillator 320 and is configured to supply a process insensitive current $I_{bias}$ to the ring oscillator 320. The process insensitive current $I_{bias}$ is generated according to the negative bias voltage $V_{NB}$. The ring oscillator 320 comprises of a plurality of inverters. The plurality of inverters has an odd number of inverters that is greater than two. And the plurality of inverters is coupled in chain having an output terminal of a last inverter $INV_N$ coupled to an input terminal of a first inverter $INV_1$.

As shown in FIG. 3, the bias current generator 310 of the clock generator 130 may comprise of a first PMOS transistor P1, a second PMOS transistor P2, a third PMOS transistor P3, a fourth PMOS transistor P4, a fifth PMOS transistor P5, a first NMOS transistor N1, and a second NMOS transistor N2. A first terminal of the first PMOS transistor P1, a first terminal the third PMOS transistor P3 and a first terminal of the fourth PMOS transistor P4 are coupled to a power supply voltage $V_{DD}$. A second terminal of the first PMOS transistor P1 is coupled to a first terminal of the second PMOS transistor P2. A control terminal of the first PMOS transistor P1 is coupled to a ground GND. A second terminal of the second PMOS transistor P2 is coupled to a control terminal of the second PMOS transistor P2, a control terminal of the fifth PMOS transistor P5, a second terminal of the third PMOS transistor P3, and a first terminal of the first NMOS transistor N1. A control terminal of the third PMOS transistor P3 is coupled to receive an enable signal EN. A second terminal of the fourth PMOS transistor P4 is coupled to a first terminal of the fifth PMOS transistor P5. A control terminal of the fourth PMOS transistor P4 is coupled to the ground GND. A second terminal of the fifth PMOS transistor P5 is coupled to a first terminal of the second NMOS transistor N2. A second terminal of the first NMOS transistor N1 and a second terminal of the second NMOS transistor N2 are coupled to the ground GND. A control terminal of the first NMOS transistor N1 receives the negative bias voltage $V_{NB}$. A control terminal of the second NMOS transistor N2 is coupled to the first terminal of the second NMOS transistor N2 and acts as an output terminal for the process insensitive current $I_{bias}$.

As shown in FIG. 3, the ring oscillator 320 has the plurality of inverters identical to each other coupled in chain. An inverter $INV_1$ comprises a PMOS transistor P1-1, a first NMOS transistor N1-1, and a second NMOS transistor N1-2. A first terminal of the PMOS transistor P1-1 is coupled to the power supply voltage $V_{DD}$. A second terminal of the PMOS transistor P1-1 is coupled to a first terminal of the first NMOS transistor N1-1 and is an output terminal of the inverter $INV_1$. A control terminal of the PMOS transistor P1-1 is coupled to a control terminal of the first NMOS transistor N1-1 and is an input terminal of the inverter $INV_1$. The PMOS transistor P1-1 and the first NMOS transistor N1-1 form a CMOS inverter. Assuming that there are N inverters coupled in chain, an output terminal of a last inverter $INV_N$ is coupled to an input terminal of a first inverter which is the inverter $INV_1$. A second terminal of the first NMOS transistor N1-1 is coupled to a first terminal of the second NMOS transistor N1-2. A second terminal of the second NMOS transistor N1-2 is coupled to the ground GND. The second NMOS transistor N1-2 acts as a load transistor. The control terminal of each of the second NMOS transistors of the inverters $INV_1$-$INV_N$ is coupled to the control terminal of the second NMOS transistor N2 of the bias current generator 310 to form a current mirror circuit. This means that the process insensitive current $I_{bias}$ flows through the load transistors in accordance with mirror ratios. The process insensitive current $I_{bias}$ will supply the plurality of inverters $INV_1$-$INV_N$ with a current independent from the process making sure that the first clock from the clock generator 130 is not affected by the process.

According to the second embodiment of the present invention as shown in FIG. 2, the pulse width generator 210 is coupled to the output of the clock generator 130. The pulse width generator 210 generates the third clock according to the number of pulses of the first clock generated by the clock generator 130.

The low dropout regulator 140 is a circuit used to generate the zero temperature coefficient voltage $V_{ZTC}$ according to the negative bias voltage $V_{NB}$. The low dropout regulator 140 is a DC linear voltage regulator which can operate with a very small input-output differential voltage. The advantage of using the low dropout regulator 140 includes a low operating voltage, high operation efficiency and low heat dissipation. The main components of the low dropout regulator 140 are a power FET and a differential amplifier. If the zero temperature coefficient voltage $V_{ZTC}$ rises too high relative to the negative bias voltage $V_{NB}$, the drive to the power FET changes to maintain the zero temperature coefficient voltage $V_{ZTC}$ at a constant value. The bandgap reference voltage $V_{bg}$ may also be used by the low dropout regulator 140 as a reference voltage in order to generate the zero temperature coefficient voltage $V_{ZTC}$.

The temperature insensitive oscillator 150 may include a bias current generator 310 and a ring oscillator 320. The temperature insensitive oscillator 150 is configured to generate the second clock that has a zero temperature coefficient. The temperature insensitive oscillator 150 can generate the second clock with constant frequency regardless of change in temperature according to the zero temperature coefficient voltage $V_{ZTC}$ generated by the low dropout regulator 140.

The counter 160 is a circuit which stores the number of times a particular event has occurred in relation to a reference clock signal. For the process monitoring system, the particular event to be counted are pulses produced by the second clock. And the reference clock signal to be used for the first embodiment of the process monitoring system is the first clock generated using the clock generator 130. For the second embodiment of the process monitoring system, the reference clock signal to be used by the counter 160 is the third clock signal generated by the pulse width generator 210 according to the first clock. The counter 160 will generate the counted number which is the number of times the pulse of the second clock occurs during a period of time according to the reference clock signal, which may be the first clock or the third clock. The count number is a number generated by the process monitoring system that corresponds to the process corner of the circuit regardless of the voltage variation and the temperature variation.

The comparison circuit 170 may be a lookup table (LUT) component which is used to generate a specific set of outputs according to a particular input combination. The lookup table can be implemented using universal data blocks (UDB) with programmable logic devices. For the process monitoring circuit, the count number generated by the counter 160 is compared to a plurality of number ranges with each range corresponding to a process corner to which the circuit operates under. Result of the comparison circuit 170 is a binary address that corresponds to the process corner of the circuit.

The charge pump 180 is a kind of DC to DC converter that uses capacitors as energy elements to create either a higher or lower voltage power source. The charge pump 180 may include a controller, a plurality of switches, and a plurality of capacitors. An external voltage source, a clock signal and a control signal can be coupled to the charge pump 180. The charge pump 180 uses at least one switching device to control connections of voltages to capacitors. Depending on the controller and circuit topology of the charge pump 180, the charge pump 180 can double voltages, triple voltages, halve voltages, invert voltages, fractionally multiply or scale voltages such as ×3/2, ×4/3, ×2/3, etc. and generate arbitrary voltages. The control signal is the binary address resulting from the comparison circuit 170. Value of the output voltage $V_O$ is generated by the charge pump 180 corresponding to the binary address from the comparison circuit 170. Note that the external voltage source may be the bandgap reference voltage $V_{bg}$ and the clock signal for the charge pump 180 may be the first clock.

The operation of the process monitoring system is further illustrated in FIG. 4 to FIG. 8, which are waveforms of clock signals generated by the process monitoring system.

The second clock signal is generated corresponding to the low dropout regulator 140 and the temperature insensitive oscillator 150. Compensation for the voltage variation and temperature is addressed in generating the second clock. Compensation for the process variation is addressed in generating the first clock. The frequency of the second clock shall correspond to a process corner of a monitored circuit.

Figure 4:
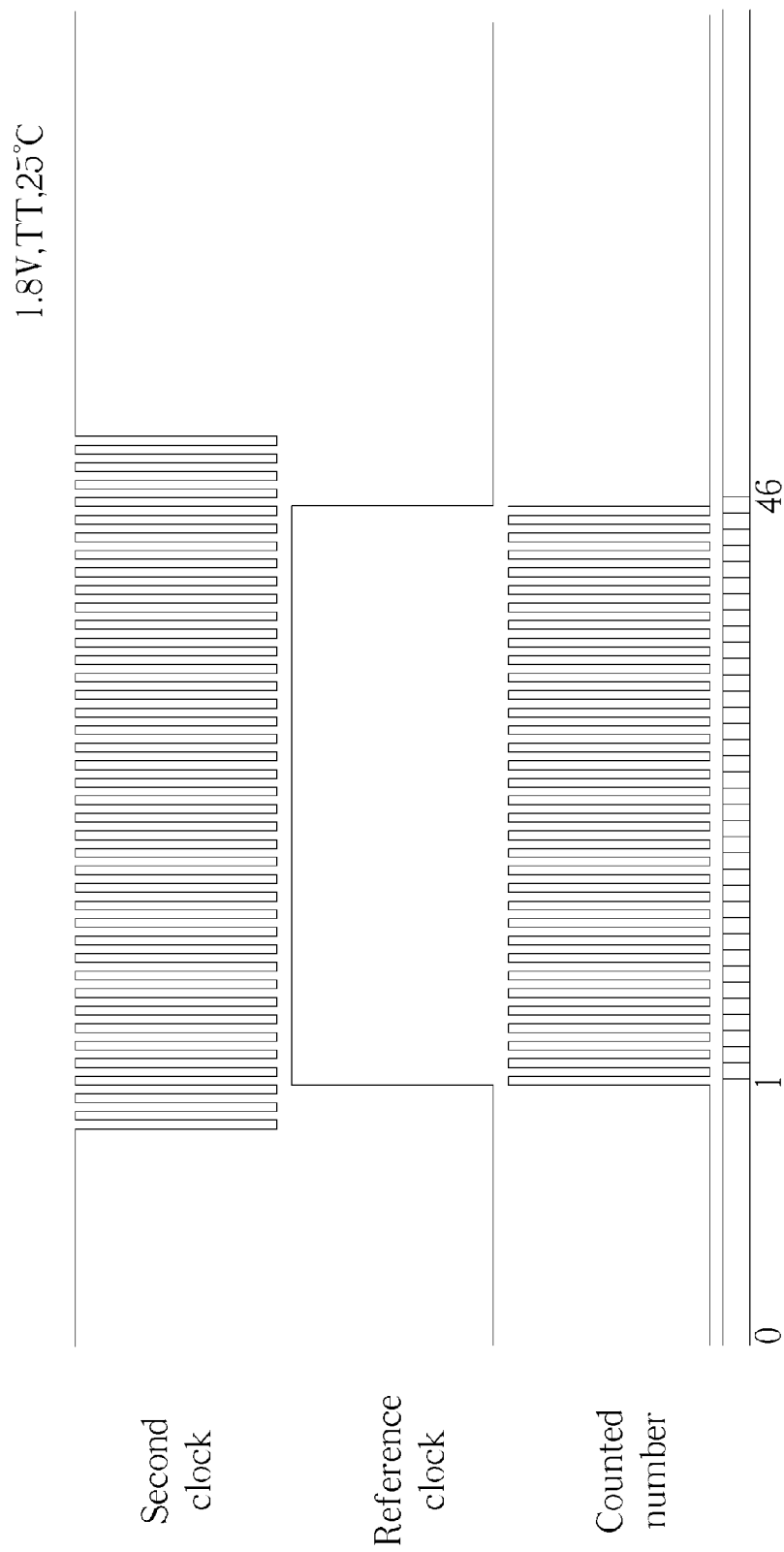
FIG. 4 illustrates a waveform of clock signals for a monitored circuit operating in TT process corner.

FIG. 4 illustrates a waveform of clock signals for a monitored circuit operating in TT process corner. The reference clock may correspond to the first clock according to the first embodiment as shown in FIG. 1 or the third clock according to the second embodiment as shown in FIG. 2. The testing condition of the monitored circuit includes a power supply of 1.8V and an operating temperature of 25° C. When the reference clock is at logic high, the counter 160 is triggered to start counting of the second clock. The counter 160 will stop counting as soon as the reference clock is switched to logic low. The counter shall generate a counted number corresponding to the process corner of the monitored circuit.

Figure 5:
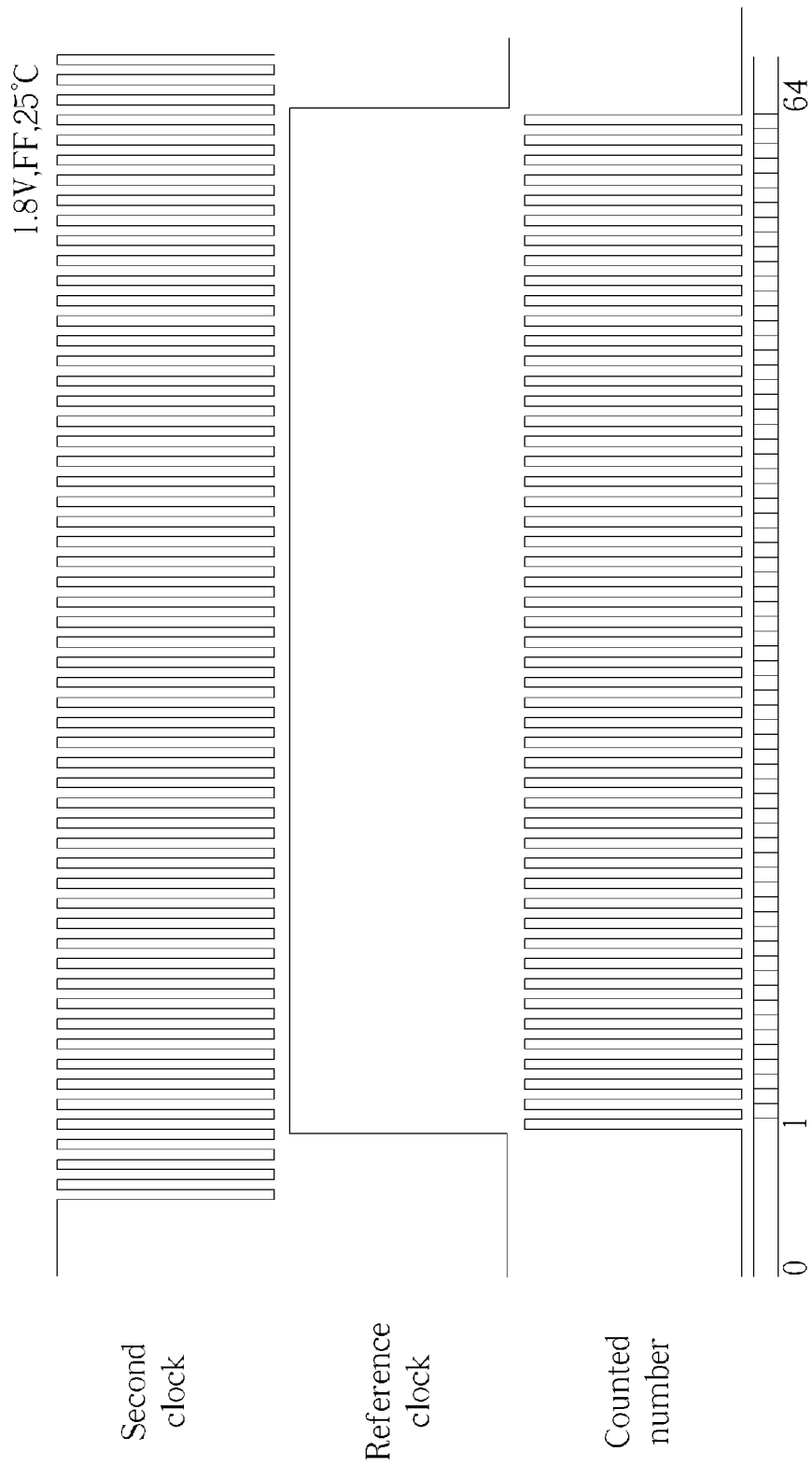
FIG. 5 illustrates a waveform of clock signals for a monitored circuit operating in FF process corner.

FIG. 5 illustrates a waveform of clock signals for a monitored circuit operating in FF process corner. The reference clock may correspond to the first clock according to the first embodiment as shown in FIG. 1 or the third clock according to the second embodiment as shown in FIG. 2. The testing condition of the monitored circuit includes a power supply of 1.8V and an operating temperature of 25° C. When the reference clock is at logic high, the counter 160 is triggered to start counting of the second clock. The counter 160 will stop counting as soon as the reference clock is switched to logic low. The counter shall generate a counted number corresponding to the process corner of the monitored circuit.

Figure 6:
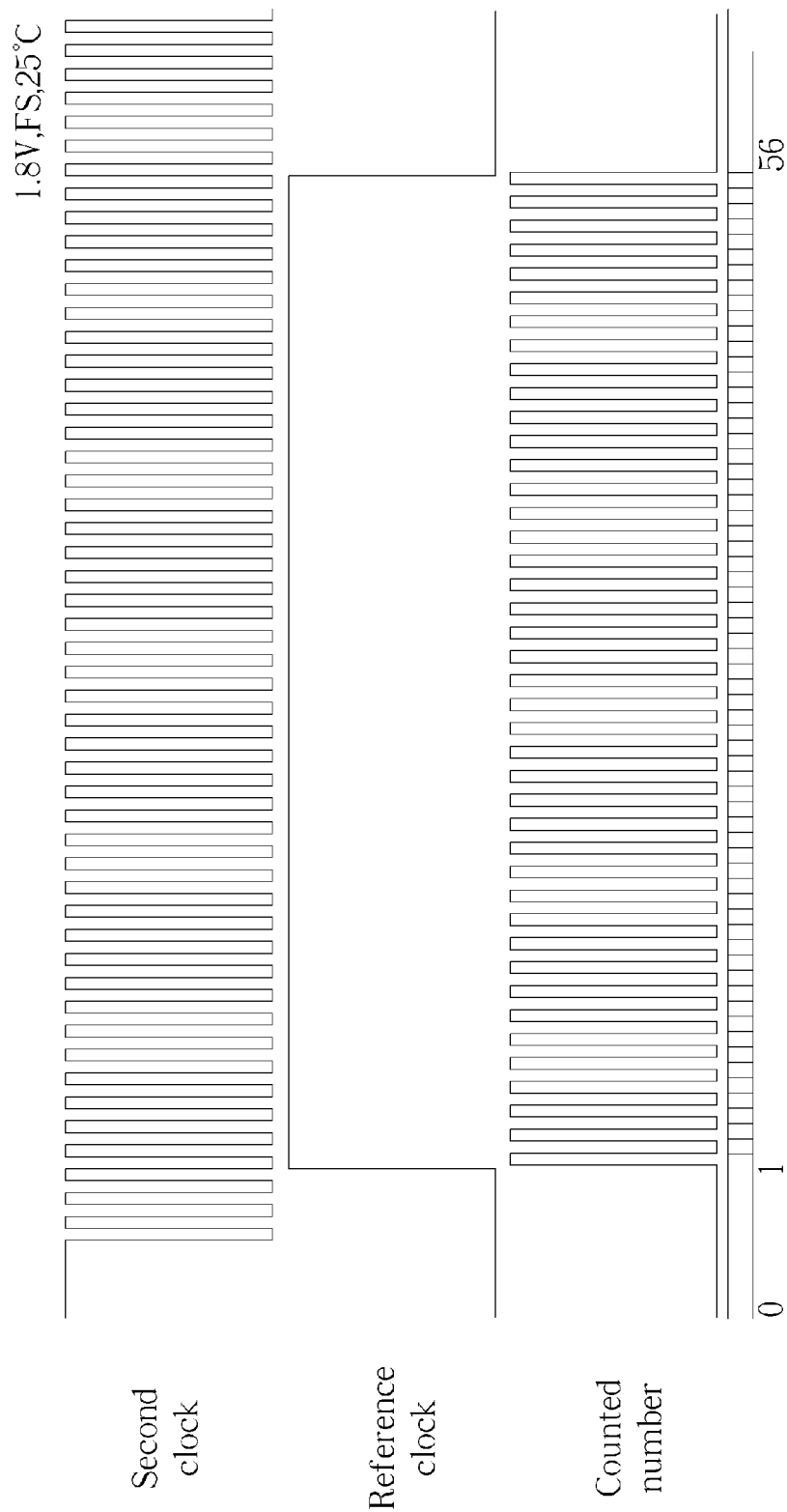
FIG. 6 illustrates a waveform of clock signals for a monitored circuit operating in FS process corner.

FIG. 6 illustrates a waveform of clock signals for a monitored circuit operating in FS process corner. The reference clock may correspond to the first clock according to the first embodiment as shown in FIG. 1 or the third clock according to the second embodiment as shown in FIG. 2. The testing condition of the monitored circuit includes a power supply of 1.8V and an operating temperature of 25° C. When the reference clock is at logic high, the counter 160 is triggered to start counting of the second clock. The counter 160 will stop counting as soon as the reference clock is switched to logic low. The counter shall generate a counted number corresponding to the process corner of the monitored circuit.

Figure 7:
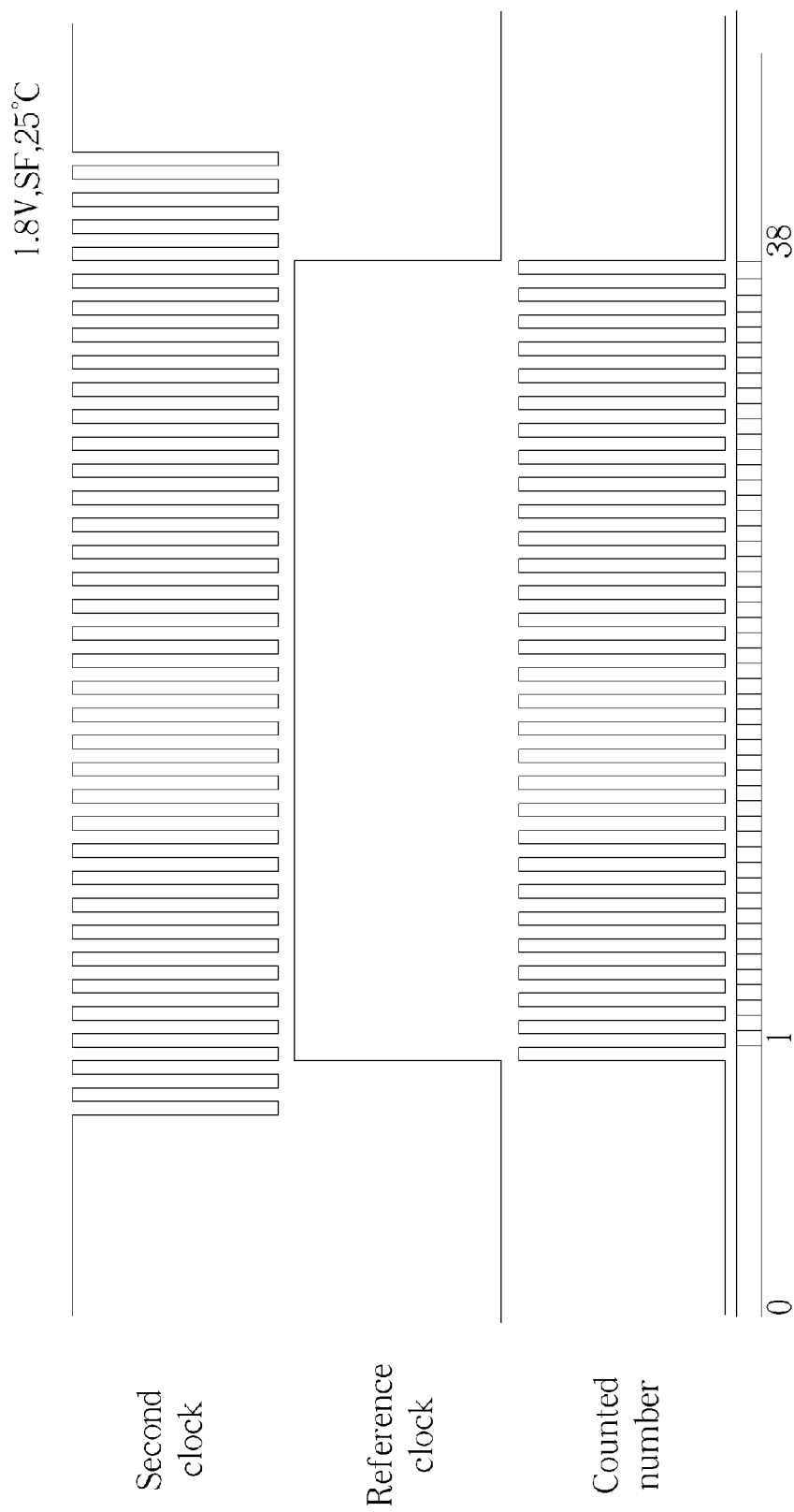
FIG. 7 illustrates a waveform of clock signals for a monitored circuit operating in SF process corner.

FIG. 7 illustrates a waveform of clock signals for a monitored circuit operating in SF process corner. The reference clock may correspond to the first clock according to the first embodiment as shown in FIG. 1 or the third clock according to the second embodiment as shown in FIG. 2. The testing condition of the monitored circuit includes a power supply of 1.8V and an operating temperature of 25° C. When the reference clock is at logic high, the counter 160 is triggered to start counting of the second clock. The counter 160 will stop counting as soon as the reference clock is switched to logic low. The counter shall generate a counted number corresponding to the process corner of the monitored circuit.

Figure 8:
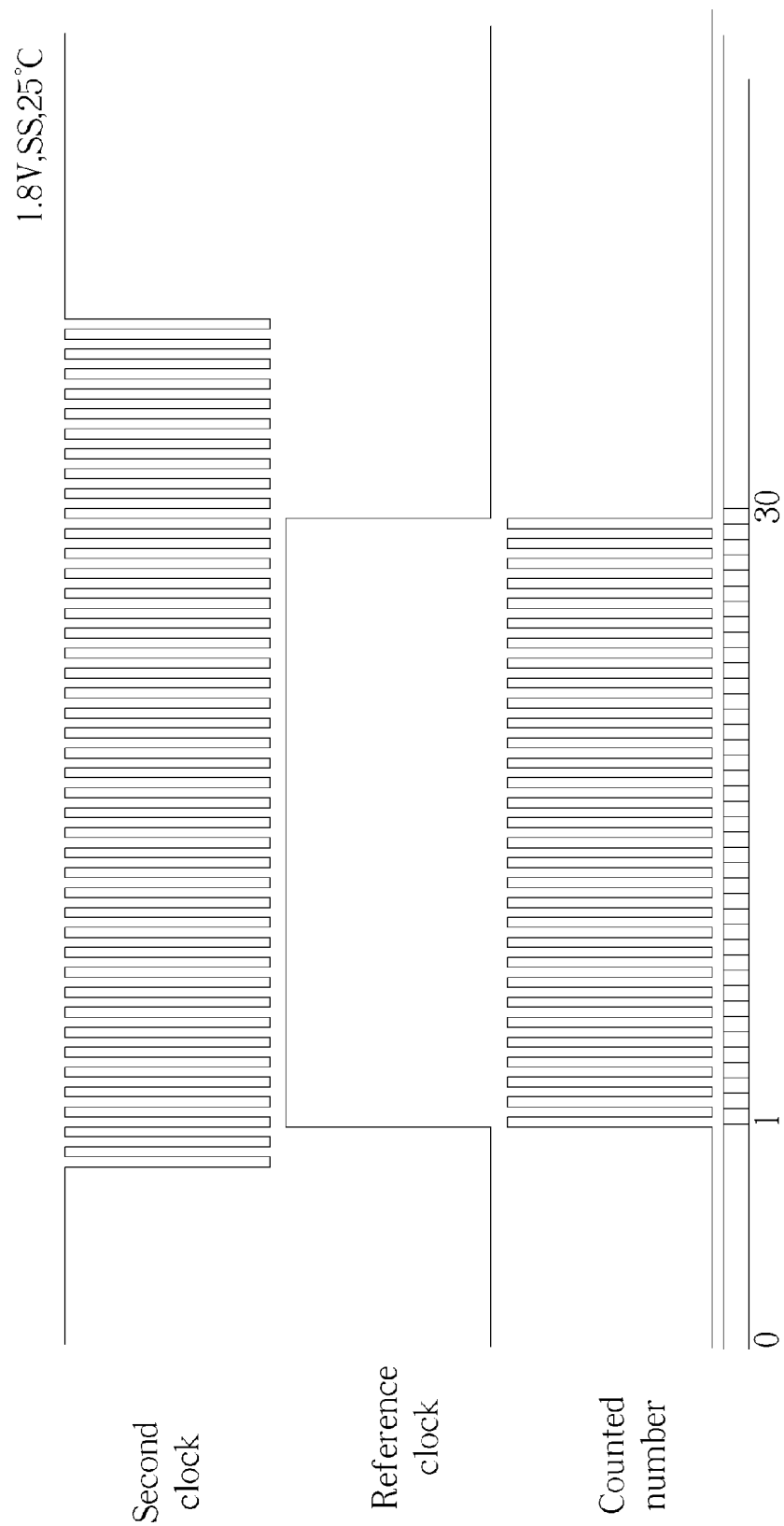
FIG. 8 illustrates a waveform of clock signals for a monitored circuit operating in SS process corner.

FIG. 8 illustrates a waveform of clock signals for a monitored circuit operating in SS process corner. The reference clock may correspond to the first clock according to the first embodiment as shown in FIG. 1 or the third clock according to the second embodiment as shown in FIG. 2. The testing condition of the monitored circuit includes a power supply of 1.8V and an operating temperature of 25° C. When the reference clock is at logic high, the counter 160 is triggered to start counting of the second clock. The counter 160 will stop counting as soon as the reference clock is switched to logic low. The counter shall generate a counted number corresponding to the process corner of the monitored circuit.

Please refer to FIG. 9. FIG. 9 illustrates a look up table for the comparison circuit 170 according to the process monitoring system. The look up table that may include a plurality of reference numbers that could be used to represent a number range for each process corner and a corresponding binary address for each of the number ranges.

As shown in FIG. 4, the counted number for the monitored circuit is 46. The comparison circuit 170 shall compare the value in the look up table where 46 falls under the number range of TT process corner. Therefore the monitored circuit is determined to operate under the TT process corner. And a corresponding binary address 011 for the TT process corner is going to be outputted by the comparison circuit 170.

As shown in FIG. 5, the counted number for the monitored circuit is 64. The comparison circuit 170 shall compare the value in the look up table where 64 falls under the number range of FF process corner. Therefore the monitored circuit is determined to operate under the FF process corner. And a corresponding binary address 101 for the FF process corner is going to be outputted by the comparison circuit 170.

As shown in FIG. 6, the counted number for the monitored circuit is 56. The comparison circuit 170 shall compare the value in the look up table where 56 falls under the number range of FS process corner. Therefore the monitored circuit is determined to operate under the FS process corner. And a corresponding binary address 100 for the FS process corner is going to be outputted by the comparison circuit 170.

As shown in FIG. 7, the counted number for the monitored circuit is 38. The comparison circuit 170 shall compare the value in the look up table where 38 falls under the number range of SF process corner. Therefore the monitored circuit is determined to operate under the SF process corner. And a corresponding binary address 010 for the SF process corner is going to be outputted by the comparison circuit 170.

As shown in FIG. 8, the counted number for the monitored circuit is 30. The comparison circuit 170 shall compare the value in the look up table where 30 falls under the number range of SS process corner. Therefore the monitored circuit is determined to operate under the SS process corner. And a corresponding binary address 001 for the SS process corner is going to be outputted by the comparison circuit 170.

The binary address which is the comparison result from the comparison circuit 170 is then inputted to the charge pump 180. The binary address will allow the charge pump 180 to generate the output voltage $V_O$ according to the process corner of the monitored circuit.

Note that illustrated waveforms and look up table above are only examples to illustrate the aspects of the present invention for clarity and not intended to limit the scope of the invention.

Figure 10:
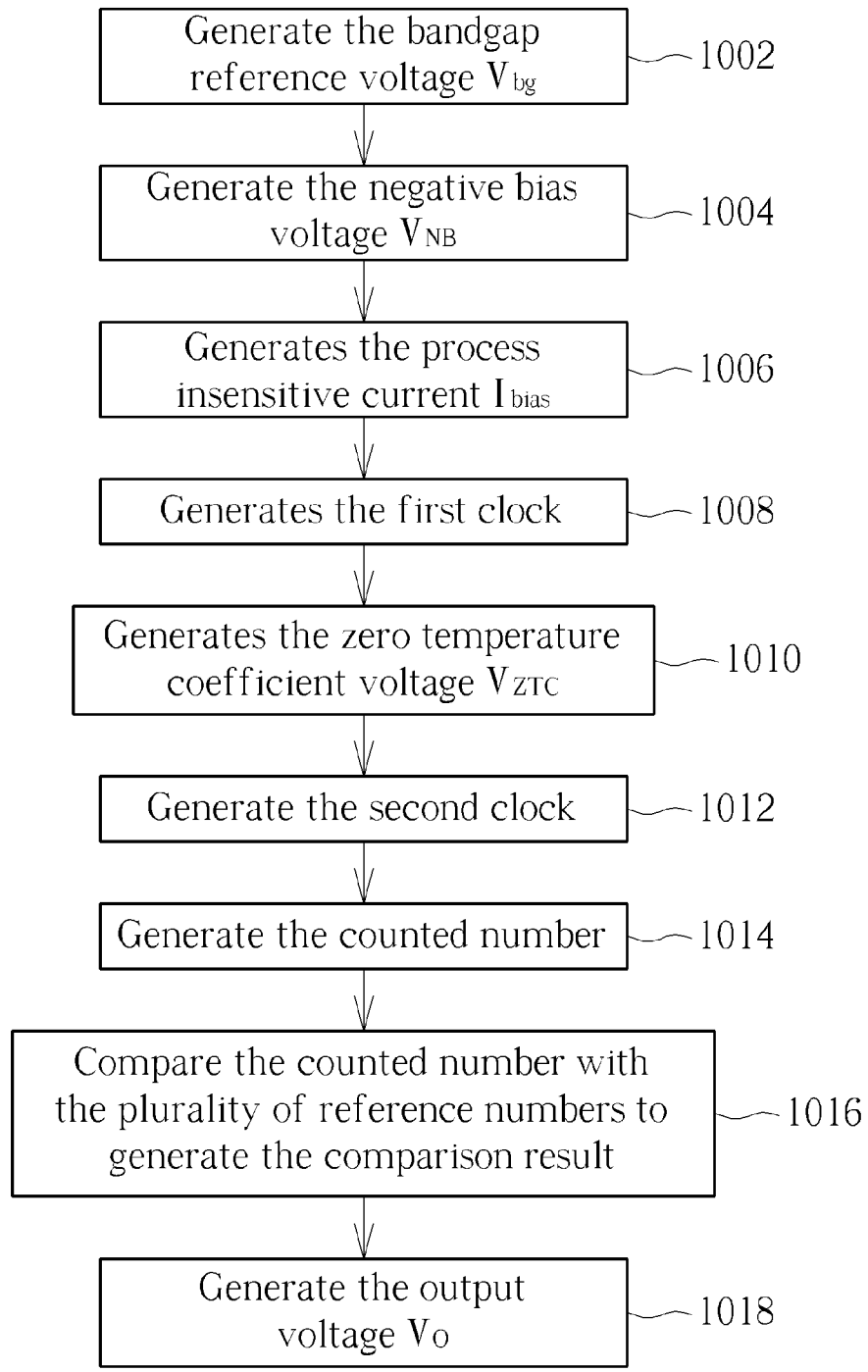
FIG. 10 illustrates a flowchart of a process monitoring method according to the first embodiment shown in FIG. 1.

Please refer to FIG. 10. FIG. 10 illustrates a flowchart of a process monitoring method according to the first embodiment of the process monitoring system shown in FIG. 1. As shown in FIG. 10, the process monitoring method may include and is not limited to the following steps:

Step 1002: The bandgap reference circuit 110 generates the bandgap reference voltage $V_{bg}$;

Step 1004: The negative bias circuit 120 generates the negative bias voltage $V_{NB}$ according to the bandgap reference voltage $V_{bg}$;

Step 1006: The current generator 310 generates the process insensitive current $I_{bias}$ for the clock generator 130 according to the negative bias voltage $V_{NB}$;

Step 1008: The ring oscillator 320 generates the first clock according to the process insensitive current $I_{bias}$;

Step 1010: The low dropout regulator 140 generates the zero temperature coefficient voltage $V_{ZTC}$ according to the negative bias voltage $V_{NB}$;

Step 1012: The temperature insensitive oscillator 150 generates the second clock according to the zero temperature coefficient voltage $V_{ZTC}$ Step 1014: The counter 160 generates the counted number according to the first clock and the second clock;

Step 1016: The comparison circuit 160 compares the counted number with the plurality of reference numbers corresponding to the plurality of respective process corners to generate the comparison result according to the process corner of the monitored circuit; and Step 1018: The charge pump 180 generates the output voltage $V_O$ according to the comparison result.

Figure 11:
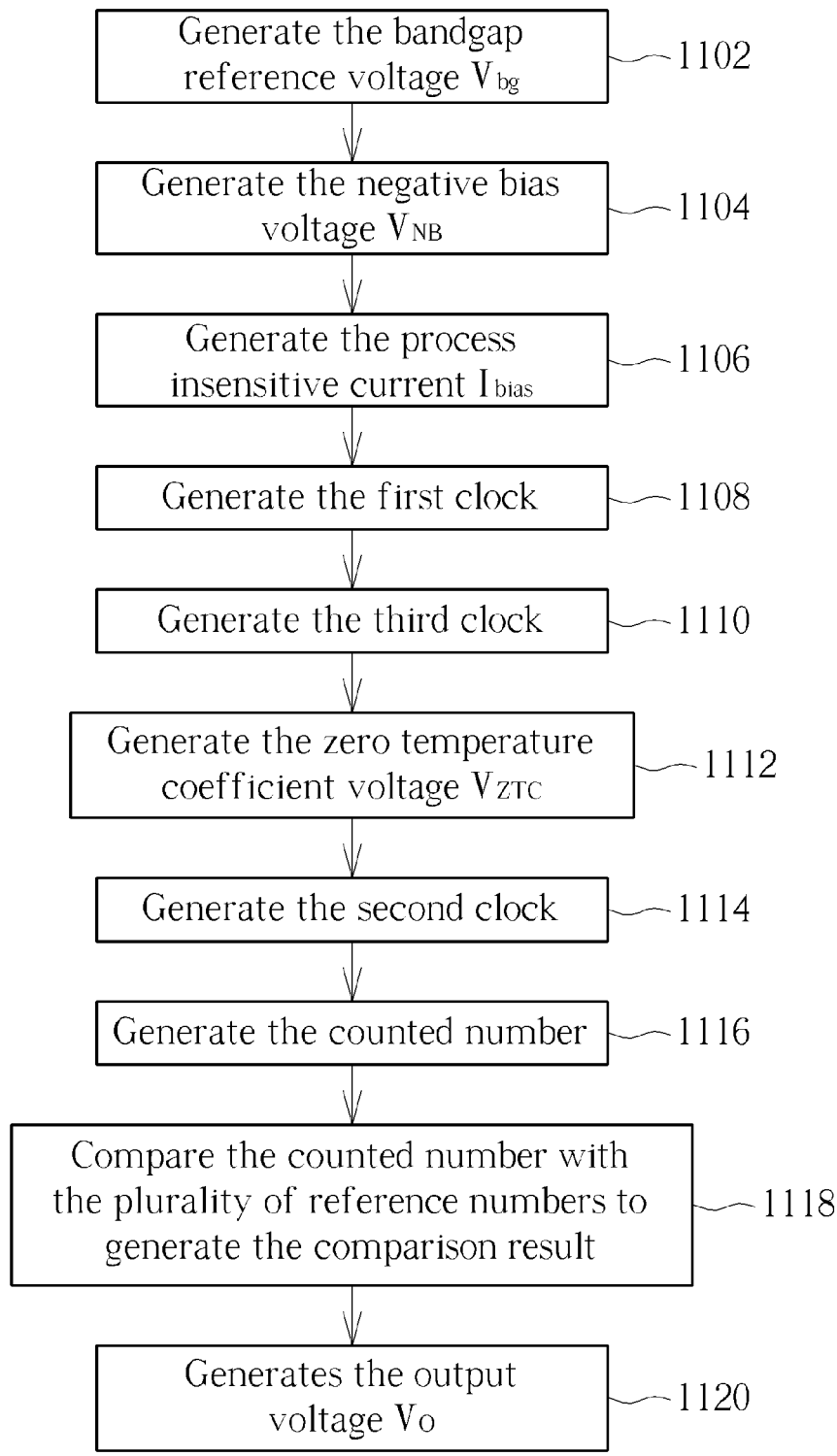
FIG. 11 illustrates a flowchart of a process monitoring method according to the second embodiment shown in FIG. 2.

Please refer to FIG. 11. FIG. 11 illustrates a flowchart of a process monitoring method according to the second embodiment of the process monitoring system shown in FIG. 2. As shown in FIG. 11, the process monitoring method may include and is not limited to the following steps:

Step 1102: The bandgap reference circuit 110 generates the bandgap reference voltage $V_{bg}$;

Step 1104: The negative bias circuit 120 generates the negative bias voltage $V_{NB}$ according to the bandgap reference voltage $V_{bg}$;

Step 1106: The current generator 310 generates the process insensitive current $I_{bias}$ for the clock generator 130 according to the negative bias voltage $V_{NB}$;

Step 1108: The ring oscillator 320 generates the first clock according to the process insensitive current $I_{bias}$;

Step 1110: The pulse width generator 210 generates the third clock according to the first clock;

Step 1112: The low dropout regulator 140 generates the zero temperature coefficient voltage $V_{ZTC}$ according to the negative bias voltage $V_{NB}$;

Step 1114: The temperature insensitive oscillator 150 generates the second clock according to the zero temperature coefficient voltage $V_{ZTC}$ Step 1116: The counter 160 generates the counted number according to the third clock and the second clock;

Step 1118: The comparison circuit 160 compares the counted number with the plurality of reference numbers corresponding to the plurality of respective process corners to generate the comparison result according to the process corner of the monitored circuit; and Step 1120: The charge pump 180 generates the output voltage $V_O$ according to the comparison result.

The present invention discloses a process monitoring system that determines the process corner of a monitored circuit. The monitored circuit may be a non-volatile memory. And an output voltage $V_O$ generated by the process monitoring system may be used as a threshold voltage for programming of the non-volatile memory. The use of the process monitoring system will eliminate occurrence of spurious programming operation since the threshold voltage applied to the non-volatile memory has been generated according to process corner the non-volatile memory falls under. The process monitoring system has also accounted for voltage variation, and temperature variation when generating the threshold voltage for the non-volatile memory.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A process monitoring circuit, comprising:
a bandgap reference circuit configured to generate a bandgap reference voltage;
a clock generator configured to generate a first clock;
a negative bias circuit coupled between the bandgap reference circuit and the clock generator and configured to generate a negative bias voltage according to the bandgap reference voltage for stabilizing operation of the clock generator;
a temperature insensitive oscillator configured to generate a second clock;
a low dropout voltage regulator coupled to the temperature insensitive oscillator and configured to generate a zero temperature coefficient voltage for stabilizing operation of the temperature insensitive oscillator;
a counter coupled to the clock generator and the temperature insensitive oscillator and configured to count number of pulses of the second clock within each duty cycle of the first clock so as to generate a counted number;
a comparison circuit coupled to the counter and configured to compare the counted number with at least one reference number to generate a comparison result; and
a charge pump coupled to the comparison circuit and configured to generate an output voltage according to the comparison result.

2. The process monitoring circuit in claim 1, wherein the clock generator comprises:
a ring oscillator having an odd number of inverters greater than two, coupled in chain with an output terminal of a last inverter coupled to an input terminal of a first inverter; and
a bias current generator coupled to the ring oscillator and configured to supply a process insensitive current to the ring oscillator.

3. The process monitoring circuit in claim 1, wherein the comparison circuit comprises:
a look up table, the look up table comprises a plurality reference numbers and a plurality of respective binary addresses;
wherein each of the binary addresses corresponds to a process corner.

4. The process monitoring circuit in claim 1, wherein the charge pump is coupled to the clock generator and the bandgap reference circuit and configured to generate the output voltage according to the first clock, the bandgap reference voltage and the comparison result.

5. The process monitoring circuit in claim 1, wherein the low dropout voltage regulator is coupled to the bandgap reference circuit and the negative bias circuit and configured to generate the zero temperature coefficient voltage according to the bandgap reference voltage and the negative bias voltage.

6. A process monitoring circuit, comprising:
a bandgap reference circuit configured to generate a bandgap reference voltage;
a clock generator configured to generate a first clock;
a negative bias circuit coupled between the bandgap reference circuit and the clock generator and configured to generate a negative bias voltage according to the bandgap reference voltage for stabilizing operation of the clock generator;
a pulse width generator coupled to the clock generator and configured to generate a third clock according to the first clock;
a temperature insensitive oscillator configured to generate a second clock;
a low dropout voltage regulator coupled to the temperature insensitive oscillator and configured to generate a zero temperature coefficient voltage for stabilizing operation of the temperature insensitive oscillator;
a counter coupled to the pulse width generator and the temperature insensitive oscillator and configured to count number of pulses of the second clock within each duty cycle of the third clock so as to generate a counted number;
a comparison circuit coupled to the counter and configured to compare the counted number with at least one reference number to generate a comparison result; and a charge pump coupled to the comparison circuit and configured to generate an output voltage according to the comparison result.

7. The process monitoring circuit in claim 6, wherein the clock generator comprises:
   a ring oscillator having an odd number of inverters greater than two, coupled in chain with output terminal of a last inverter coupled to an input terminal of a first inverter; and
   a bias current generator coupled to the ring oscillator and configured to supply a process insensitive current to the ring oscillator.

8. The process monitoring circuit in claim 6, wherein the comparison circuit comprises:
   a look up table, the look up table comprises a plurality reference numbers and a plurality of respective binary addresses;
   wherein each of the binary addresses corresponds to a process corner.

9. The process monitoring circuit in claim 6, wherein the charge pump is coupled to the clock generator and the bandgap reference circuit and configured to generate the output voltage according to the first clock, the bandgap reference voltage and the comparison result.

10. The process monitoring circuit in claim 7, wherein the low dropout voltage regulator is coupled to the bandgap reference circuit and the negative bias circuit and configured to generate the zero temperature coefficient voltage according to the bandgap reference voltage and the negative bias voltage.

11. A process monitoring method comprising:
   generating a bandgap reference voltage;
   generating a negative bias voltage according to the bandgap reference voltage;
   generating a first reference current for a clock generator according to the negative bias voltage;
   generating a first clock according to the first reference current;
   generating a zero temperature coefficient voltage according to the negative bias voltage;
   generating a second clock by a temperature insensitive oscillator according to the zero temperature coefficient voltage;
   generating a counted number according to the first clock and the second clock;
   comparing the counted number with at least one reference number to generate a comparison result; and
   generating an output voltage according to the comparison result.

12. The process monitoring method in claim 11, wherein generating the first clock according to the first reference current is generating the first clock by the clock generator according to the first reference current.

13. The process monitoring method in claim 11, further comprising generating a third clock according to the first clock, wherein generating the counted number according to the first clock and the second clock is generating the counted number according to the third clock and the second clock.

14. The process monitoring method in claim 13, wherein generating the third clock is generating the third clock by a pulse width generator.

15. The process monitoring method in claim 13, wherein generating the counted number according to the first clock and the second clock is a counter counting a number of pulses of the second clock for a period of time corresponding to a pulse width of the third clock.

16. The process monitoring method in claim 13, wherein a clock period of the third clock is at least two times higher than a clock period of the second clock.

17. The process monitoring method in claim 11, wherein generating the counted number according to the first clock and the second clock is a counter counting a number of pulses of the second clock for a period of time corresponding to a pulse width of the first clock.

18. The process monitoring method in claim 11, wherein a clock period of the first clock is at least two times higher than a clock period of the second clock.

19. The process monitoring method in claim 11, wherein comparing the counted number with at least one reference number to generate the comparison result is comparing of the counted number with a plurality of reference numbers of a look up table in the comparison circuit to determine a corresponding process corner of a monitored circuit and generating the comparison result according to the process corner of the monitored circuit and the look up table.

20. The process monitoring method in claim 19, wherein the comparison result is a binary address corresponding to the process corner of the monitored circuit.

* * * * *